United States Patent
Nam et al.

(10) Patent No.: US 10,908,249 B2
(45) Date of Patent: Feb. 2, 2021

(54) METHOD AND APPARATUS FOR MONITORING SECONDARY POWER DEVICE, AND ELECTRONIC SYSTEM INCLUDING THE APPARATUS

(71) Applicant: SAMSUNG ELECTRONICS CO., LTD., Suwon-si (KR)

(72) Inventors: Suck-Hyun Nam, Hwaseong-si (KR); Min-Sung Kil, Hwaseong-si (KR); Hyoung-Taek Lim, Seoul (KR); Sang-Hoon Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 37 days.

(21) Appl. No.: 16/298,753

(22) Filed: Mar. 11, 2019

(65) Prior Publication Data
US 2020/0064430 A1 Feb. 27, 2020

(30) Foreign Application Priority Data
Aug. 23, 2018 (KR) .................. 10-2018-0098767

(51) Int. Cl.
*G01R 35/00* (2006.01)
*G11C 5/14* (2006.01)
(Continued)

(52) U.S. Cl.
CPC .............. *G01R 35/007* (2013.01); *G01R 1/28* (2013.01); *G01R 27/28* (2013.01); *G01R 27/32* (2013.01);
(Continued)

(58) Field of Classification Search
CPC ...... G01R 35/005; G01R 27/28; G01R 27/32; G01R 35/00; G01R 1/28
(Continued)

(56) References Cited

U.S. PATENT DOCUMENTS

| 3,573,483 A | * | 4/1971 | White | H02J 9/061 |
| | | | | 307/66 |
| 6,897,635 B2 | * | 5/2005 | Ozawa | H02J 7/0047 |
| | | | | 320/127 |

(Continued)

FOREIGN PATENT DOCUMENTS

| JP | 4711917 B2 | 6/2011 |
| JP | 5480434 B1 | 4/2014 |

(Continued)

*Primary Examiner* — Clayton E. LaBelle
*Assistant Examiner* — Kevin C Butler
(74) *Attorney, Agent, or Firm* — Volentine Whitt & Francos, PLLC

(57) ABSTRACT

A method and apparatus for monitoring a secondary power device, for accurately checking a state of the secondary power device, and an electronic system including the apparatus are provided. The method of monitoring a secondary power device includes: setting a first reference parameter by using a voltage of at least one capacitor of the secondary power device; setting a second reference parameter by using the voltage of the at least one capacitor and the first reference parameter; and setting a reference level for checking of the state of the secondary power device by using the second reference parameter, wherein the reference level is used in checking of the state of the secondary power device.

20 Claims, 17 Drawing Sheets

(51) Int. Cl.
  *H02J 7/34* (2006.01)
  *G01R 31/3835* (2019.01)
  *G01R 27/32* (2006.01)
  *G01R 1/28* (2006.01)
  *G01R 27/28* (2006.01)

(52) U.S. Cl.
  CPC ......... *G01R 31/3835* (2019.01); *G01R 35/00* (2013.01); *G01R 35/005* (2013.01); *G11C 5/141* (2013.01); *G11C 5/148* (2013.01); *H02J 7/345* (2013.01)

(58) Field of Classification Search
  USPC ........................................................ 324/601
  See application file for complete search history.

(56) References Cited

U.S. PATENT DOCUMENTS

| | | | | |
|---|---|---|---|---|
| 7,469,189 | B2* | 12/2008 | Yasuo | G06F 11/24 |
| | | | | 702/185 |
| 7,742,885 | B2* | 6/2010 | Oohasi | H02J 7/1461 |
| | | | | 702/63 |
| 7,808,244 | B2* | 10/2010 | Barsukov | G01R 31/3842 |
| | | | | 324/430 |
| 8,310,083 | B2* | 11/2012 | Huber | H02J 1/102 |
| | | | | 307/9.1 |
| 8,880,913 | B2* | 11/2014 | Holsen | H01M 10/486 |
| | | | | 713/300 |
| 8,957,639 | B2* | 2/2015 | Holsen | H01M 10/425 |
| | | | | 320/134 |
| 8,981,788 | B2* | 3/2015 | Ishida | G01R 31/382 |
| | | | | 324/548 |
| 9,178,380 | B2* | 11/2015 | Kawai | H02J 7/045 |
| 9,290,904 | B2* | 3/2016 | Takeo | E02F 9/26 |
| 9,869,724 | B2* | 1/2018 | Kimura | G01R 31/3835 |
| 10,386,901 | B2* | 8/2019 | Van Der Lee | G06F 1/26 |
| 2018/0018790 | A1* | 1/2018 | Lachner | G06T 7/11 |
| 2020/0064430 | A1* | 2/2020 | Nam | H02J 7/345 |

FOREIGN PATENT DOCUMENTS

| | | | | |
|---|---|---|---|---|
| JP | 6088126 B2 | 3/2017 | | |
| KR | 100505484 | 7/2005 | | |
| KR | 1020090039055 | * 5/2009 | ............ | G01R 31/50 |
| KR | 101019342 | 2/2011 | | |
| KR | 1020150096631 | 8/2015 | | |

\* cited by examiner

FIG. 5A
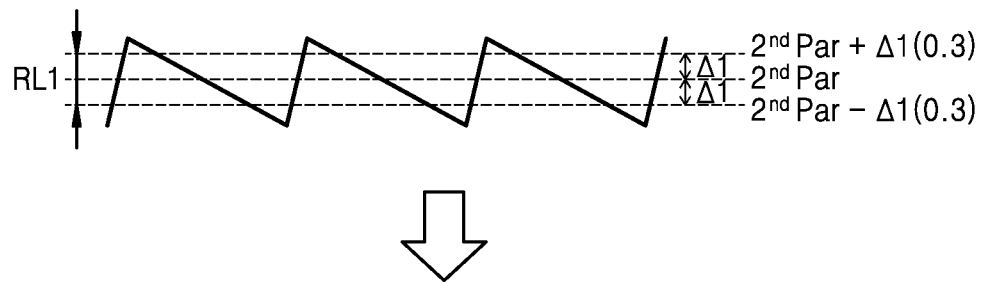
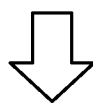
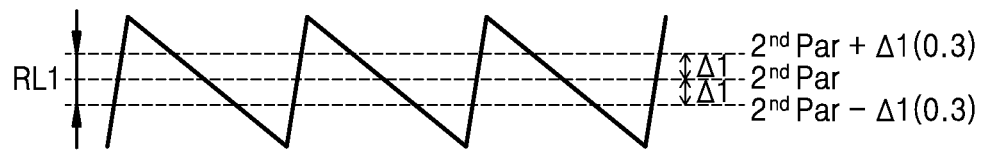
FIG. 5B
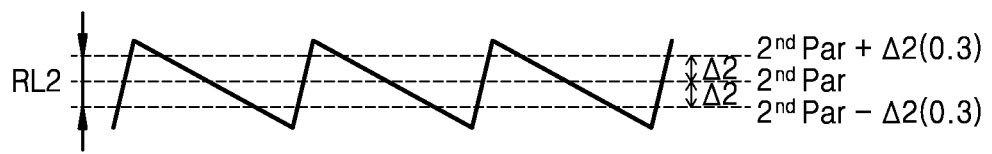
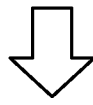
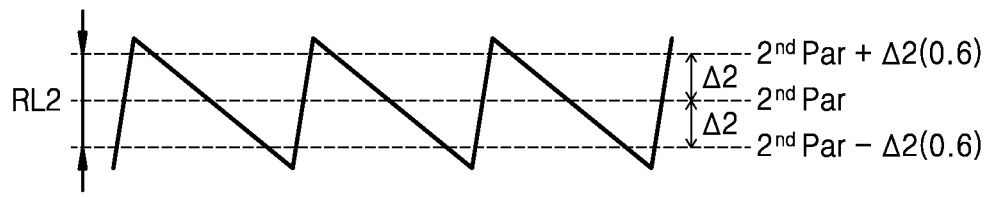

METHOD AND APPARATUS FOR MONITORING SECONDARY POWER DEVICE, AND ELECTRONIC SYSTEM INCLUDING THE APPARATUS

CROSS-REFERENCE TO RELATED APPLICATION

This application claims the benefit of Korean Patent Application No. 10-2018-0098767, filed on Aug. 23, 2018, in the Korean Intellectual Property Office, the disclosure of which is incorporated herein in its entirety by reference.

BACKGROUND

The inventive concept relates to a power device, and more particularly, to a secondary power device secondarily supplying power, and an electronic system including the secondary power device.

Memory systems including memory devices and a memory controller typically operate by receiving externally-supplied power. Meanwhile, during operation of a memory system, a sudden power-off (SPO) event where power is suddenly interrupted may occur. A memory controller stores data by using a volatile memory, and thus data stored in the volatile memory may be lost, or an ongoing operation in a memory device (for example, an erase operation, a write operation, or the like) may not be completed when an SPO event occurs. To solve this problem, a memory system may complete an ongoing operation by using a secondary power device, and perform a data backup operation.

SUMMARY

The inventive concept provides a method and apparatus for monitoring a secondary power device, in which the state of the secondary power device may be accurately checked, and an electronic system including the apparatus.

According to an aspect of the inventive concept, there is provided a method of monitoring a secondary power device, the method including: charging, by a charging unit, the secondary power device including at least one capacitor, by supplying power from the charging unit to the secondary power device; setting, by a calibration unit, a first reference parameter in a first calibration interval by using a voltage of the at least one capacitor; setting, by the calibration unit, a second reference parameter in a second calibration interval by using the voltage of the at least one capacitor and the first reference parameter; setting, by a level setting unit, a reference level for checking a state of the secondary power device, by using the second reference parameter; and monitoring, by a monitoring unit, the state of the secondary power device by using the reference level.

According to another aspect of the inventive concept, there is provided a method of monitoring a secondary power device, the method including: charging, by a charging unit, the secondary power device including at least one capacitor, by supplying power from the charging unit to the secondary power device; setting, by a calibration unit, a first reference parameter in a first calibration interval, by using a voltage of the at least one capacitor, wherein the voltage ripples between a local maximum value and a local minimum value; setting, by the calibration unit, a second reference parameter in a second calibration interval, by using the voltage of the at least one capacitor and the first reference parameter; setting, by a level setting unit, a reference level for checking a state of the secondary power device, by using the second reference parameter, wherein the reference level is set to a range of $\pm\Delta$ about a central value which is set to the second reference parameter; and monitoring, by a monitoring unit, a state of the secondary power device by using the reference level, wherein operations from the setting of the first reference parameter to the setting of the reference level are repeated for a set period.

According to yet another aspect of the inventive concept, there is provided a method of monitoring a secondary power device, the method including: charging, by a charging unit, the secondary power device including at least one capacitor, by supplying power from the charging unit to the secondary power device; setting, by a calibration unit, a first reference parameter in a first calibration interval by using a voltage of the at least one capacitor, wherein the voltage ripples between a local maximum value and a local minimum value; setting, by the calibration unit, a second reference parameter in a second calibration interval by using the voltage of the at least one capacitor and the first reference parameter; setting a reference level for checking a state of the secondary power device, wherein the reference level is set to a range of $\pm\Delta$ about a central value which is set to the second reference parameter; and monitoring the state of the secondary power device by using the reference level, wherein after setting the second reference parameter, the voltage of the at least one capacitor is used in further setting of the second reference parameter and the setting of the reference level to calibrate the reference level in real time.

According to still another aspect of the inventive concept, there is provided an apparatus for monitoring a secondary power device, the apparatus including: a voltage measuring unit configured to measure a voltage of at least one capacitor of the secondary power device; a calibration unit configured to set a first reference parameter and a second reference parameter by using the voltage of the at least one capacitor; a level setting unit configured to set a reference level for checking a state of the secondary power device by using the second reference parameter; and a monitoring unit including a discharging time measuring unit and a determining unit, wherein the discharging time measuring unit is configured to measure a discharging time of the at least one capacitor by using the reference level, and the determining unit is configured to determine a state of the secondary power device by comparing the discharging time with a set reference time.

According to a further aspect of the inventive concept, there is provided an electronic system including: a power loss protection (PLP) unit including a secondary power device including at least one capacitor and a charging unit configured to supply power to the secondary power device; a main system unit including a controller and at least one memory chip; and a power unit operatively connected between the PLP unit and the main system unit, the power unit supplying power to the main system unit, wherein a monitoring apparatus for monitoring a state of the secondary power device is arranged in one of the PLP unit and the main system unit, wherein the monitoring apparatus includes: a voltage measuring unit configured to measure a voltage of the at least one capacitor; a calibration unit configured to set a first reference parameter and a second reference parameter by using the voltage of the at least one capacitor; a level setting unit configured to set a reference level for checking a state of the secondary power device, by using the second reference parameter; and a monitoring unit including a discharging time measuring unit and a determining unit, wherein the discharging time measuring unit is configured to measure a discharging time of the at least one capacitor by using the reference level, and the determining unit is configured to determine a state of the secondary power device by comparing the discharging time with a set reference time.

According to a still further aspect of the inventive concept, there is provided a method, comprising: a charging unit charging a secondary power device; in a first interval, measuring a capacitor voltage of the secondary power device; detecting first local minimum values and first local maximum values of the measured capacitor voltage in the first interval; setting a first reference parameter based on detected local minimum values and local maximum values; in a second interval, measuring the capacitor voltage of the secondary power device; setting a second reference parameter based on values of the measured capacitor voltage in the second interval together with the first reference parameter; setting a reference level as a range centered about a voltage set to the second reference parameter; in a third interval, measuring the capacitor voltage of the secondary power device; measuring a discharging time of the capacitor voltage in the third interval by using the measured capacitor voltage in the third interval and the reference level; and comparing the discharging time with a set reference time to determine whether the secondary power device is operating abnormally.

BRIEF DESCRIPTION OF THE DRAWINGS

Embodiments of the inventive concept will be more clearly understood from the following detailed description taken in conjunction with the accompanying drawings.

FIGS. 5A and 5B are detailed graphs for describing an operation of setting a reference level in the monitoring method of a secondary power device of FIG. 1.

DETAILED DESCRIPTION OF THE EMBODIMENTS

Figure 1:
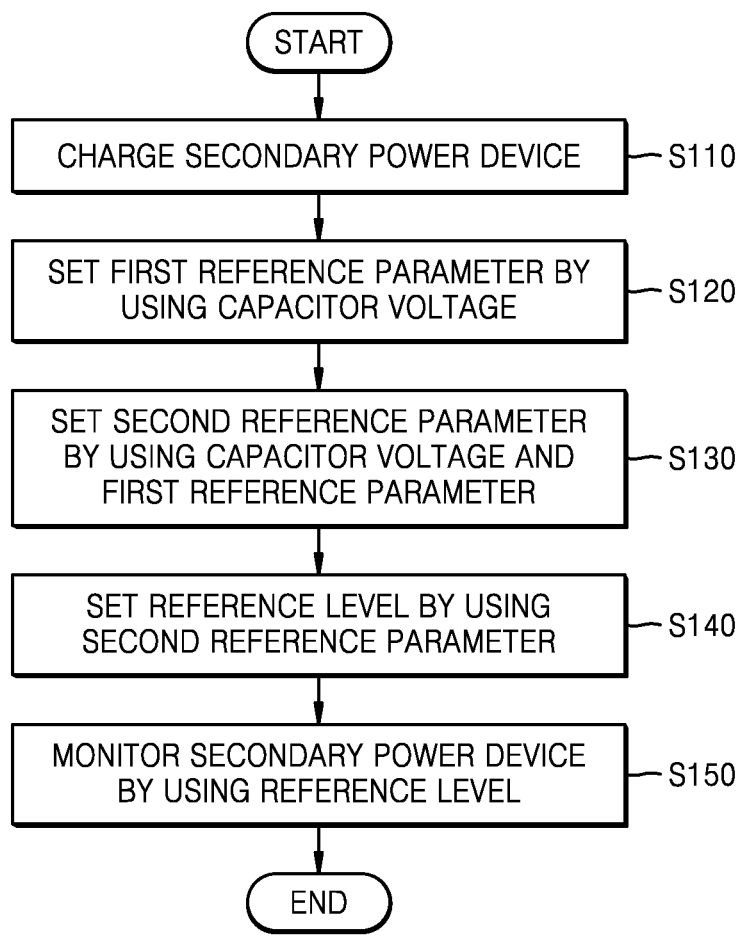
FIG. 1 is a schematic flowchart of an embodiment of a monitoring method of a secondary power device.

Hereinafter, embodiments will be described in detail with reference to the accompanying drawings. In the drawings, like elements are labeled like reference numerals and repeated description thereof will be omitted.

FIG. 1 is a schematic flowchart of an embodiment of a monitoring method of a secondary power device. For convenience of understanding, FIG. 10 will also be referred to in the description of FIG. 1.

Referring to FIG. 1, according to the monitoring method of a secondary power device of the present embodiment, first, a secondary power device 200 (see FIG. 10) is charged by using a charging unit 300 (S110). Secondary power device 200 may include at least two capacitors 210 that are connected using at least one of a serial connection method, a serial and parallel connection method, and a parallel connection method. Charging unit 300 may include, for example, a DC-DC converter. The DC-DC converter will be described in more detail with reference to FIGS. 11A and 11B. Charging may refer to charging capacitors 210 in secondary power device 200. In addition, charging may indicate periodically and repeatedly charging secondary power device 200 by using charging unit 300. Furthermore, charging may continue until the method of monitoring secondary power device 200 is finished.

Next, a first reference parameter Par1 (see Par1 of FIG. 2) is set by using a voltage of capacitors 210 of secondary power device 200 (S120). The voltage of capacitors 210 may be measured using a voltage measuring unit 110. Accordingly, the first reference parameter Par1 may be set using a voltage of capacitors 210 obtained by using voltage measuring unit 110. Meanwhile, not all voltages of capacitors 210 measured using voltage measuring unit 110 are stored, but only a certain voltage may be stored. For example, in a certain section or time interval, only a maximum value and/or a minimum value may be stored via comparison logic from among measured voltages of capacitors 210. The comparison logic may refer to a logic through which two values are compared to calculate a higher value or a lower value as a resultant value, wherein a newly input value is continuously compared with a resultant value to calculate a maximum value or a minimum value in a relevant section or interval. The first reference parameter Par1 may be set as an average value of a maximum value and a minimum value from among voltages of capacitors 210 measured in a section or interval. An operation of setting up the first reference parameter Par 1 will be described in more detail later with reference to FIGS. 2 and 3.

Next, a second reference parameter Par2 (see FIG. 2) is set by using the voltage of capacitors 210 of charging unit 300 and the first reference parameter Par1 (S130). A method of setting the second reference parameter Par2 described briefly is performed as follows: first, a voltage of capacitors 210 of each section or interval is measured, and here, local maximum values and local minimum values of the voltage of capacitors 210 of each section or interval are detected. Next, a first average value, which is an average of the local maximum values, and a second average value, which is an average of the local minimum values, are calculated and an average of the first average value and the second average value are set as a second reference parameter Par2. An operation of setting the second reference parameter Par2 will be described in more detail with reference to FIGS. 2 and 4.

After setting the second reference parameter Par2, a reference level RL (see FIG. 2) for checking a state of secondary power device 200 is set by using the second reference parameter Par2 (S140). The reference level RL may be set to be, for example, a range of $\pm\Delta$ with respect to the second reference parameter Par2. In other words, the reference level RL may be set to be a range from 'the second reference parameter Par2−Δ' to 'the second reference parameter Par2+Δ'. Δ may be set to a fixed value. In addition, Δ may be set to be proportional in conjunction with a particular value. Setting of the reference level RL will be described in more detail with reference to FIGS. 5A and 5B.

After setting the reference level RL, secondary power device 200 is monitored in real time by using the reference level RL (S150). Monitoring may refer to an operation of determining whether secondary power device 200 is in a normal state or in an abnormal state by using a voltage of capacitors 210 of secondary power device 200. For example, a discharging time during which a voltage of capacitors 210 of secondary power device 200 drops to within the reference level RL may be measured, and then the state of secondary power device 200 may be determined by comparing the discharging time with a reference time. As a specific example, when a discharging time of capacitors 210 is equal to a reference time within a set error range, then secondary power device 200 may be determined to be in a normal state; when a discharging time of capacitors 210 is not equal to a reference time within a set error range, secondary power device 200 may be determined to be in an abnormal state. Monitoring of secondary power device 200 will be described in more detail with reference to FIGS. 6A through 7.

According to an embodiment of the monitoring method of a secondary power device, the first and second reference parameters Par1 and Par2 may be set by using a substantial voltage of capacitors 210 of secondary power device 200, and also, a reference level as a detection level used to check a state of secondary power device 200 may be set by using the second reference parameter Par2. In other words, according to the embodiment of the monitoring method of a secondary power device, a reference level used to check the state of secondary power device 200 is automatically set up according to an environment (e.g., ambient or operating temperature) of a device, thereby preventing an error in checking of the state of secondary power device 200, which may occur due to an error in a charging voltage or discharging voltage according to sample variation based on the environment of devices. In addition, by monitoring secondary power device 200 in real time by using the reference level that is continuously calibrated in real time, the error rate may be minimized compared to a method according to the related art, in which sample data extracted at a particular time is used.

For reference, in a typical monitoring method of a secondary power device according to the related art, a sample of a section with respect to a capacitor voltage is extracted, and a fixed detection level is used, and here, error may occur in checking of the state of the secondary power device due to sample variation. For example, it may be typically assumed that a voltage of a capacitor of a secondary power device ripples between about 20.6 V and about 20.0 V according to a charging operation of a charging unit. In addition, a detection level is assumed to be between about 20.5 V and about 20.1 V. When sample variation is about ±5%, a maximal capacitor voltage may ripple between about 21.53 V and about 21 V. A minimal capacitor voltage may ripple between about 19.57 V and about 19.0 V. Thus, when a detection level is maintained at between about 20.5 V and about 20.1 V, the capacitor voltage may be outside the detection level, making it impossible to check the state of the secondary power device. In other words, in order to check the state of the secondary power device, a discharging time at which the capacitor voltage drops to the detection level of from about 20.5 V to about 20.1 V is measured, and when the capacitor voltage ripples in a range outside the detection level, it is not at all possible to measure a discharging time, and accordingly, the state of the secondary power device may not be checked properly.

Sample variation may occur due to, for example, an error in a circuit of a charging unit itself or interference caused by peripheral circuits. The higher the voltage, the greater may be the sample variation. Meanwhile, a secondary power device typically involves sample variation, and such sample variation may cause the secondary power device to be determined to be in an abnormal state or may even make it impossible to determine the state thereof, and thus can be a serious problem in a monitoring method of a secondary power device. In addition, a capacitor voltage may also be changed not only due to sample variation but also due to a temperature change caused by an operation of a device or a change in ambient temperature, and when a fixed detect level is applied also in these cases, errors may occur in checking of the state of the secondary power device.

However, according to the monitoring method of secondary power device 200, a reference level used to check the state of a secondary power device is automatically set through the above-described process, and the reference level is used in checking the state of secondary power device 200, thereby preventing an error in checking of state of secondary power device 200 that may occur due to sample variation or a temperature change. In addition, secondary power device 200 is monitored in real time as the reference level is continuously calibrated in real time, and an error rate of checking of the state of secondary power device 200 may be minimized accordingly.

Figure 2:
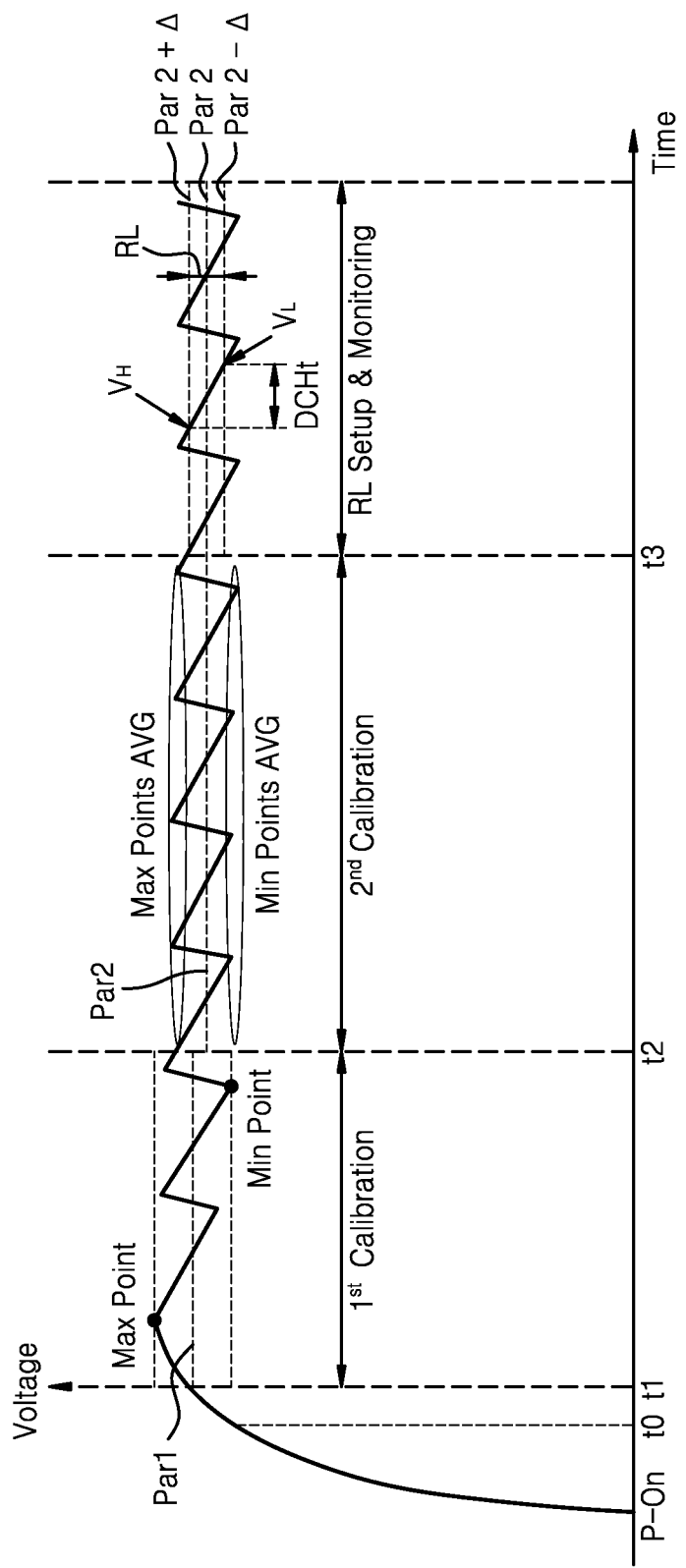
FIG. 2 is a graph showing a detailed process of the monitoring method of a secondary power device of FIG. 1.
Figure 3:
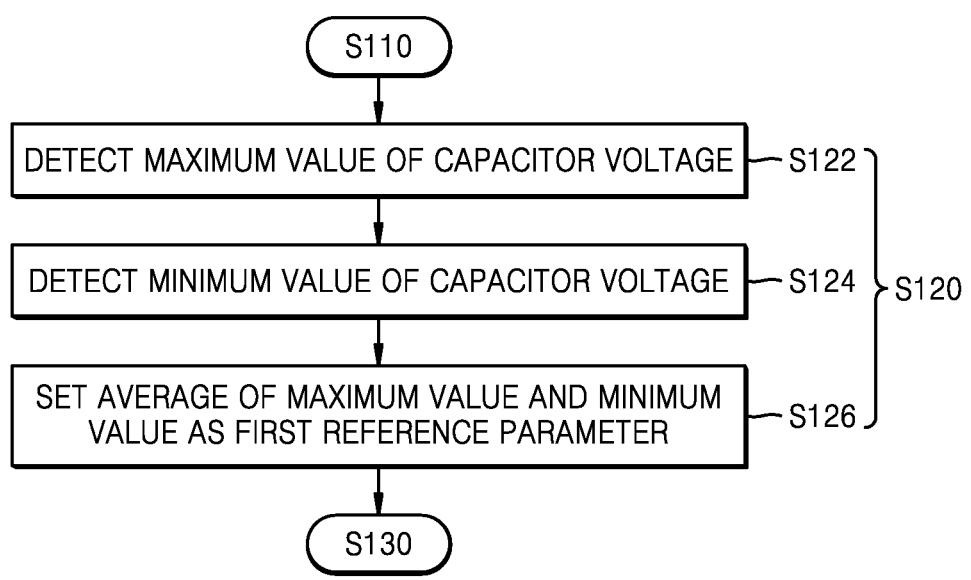
FIG. 3 is a detailed flowchart of an operation of setting a first reference parameter in the monitoring method of a secondary power device of FIG. 1.
Figure 4:
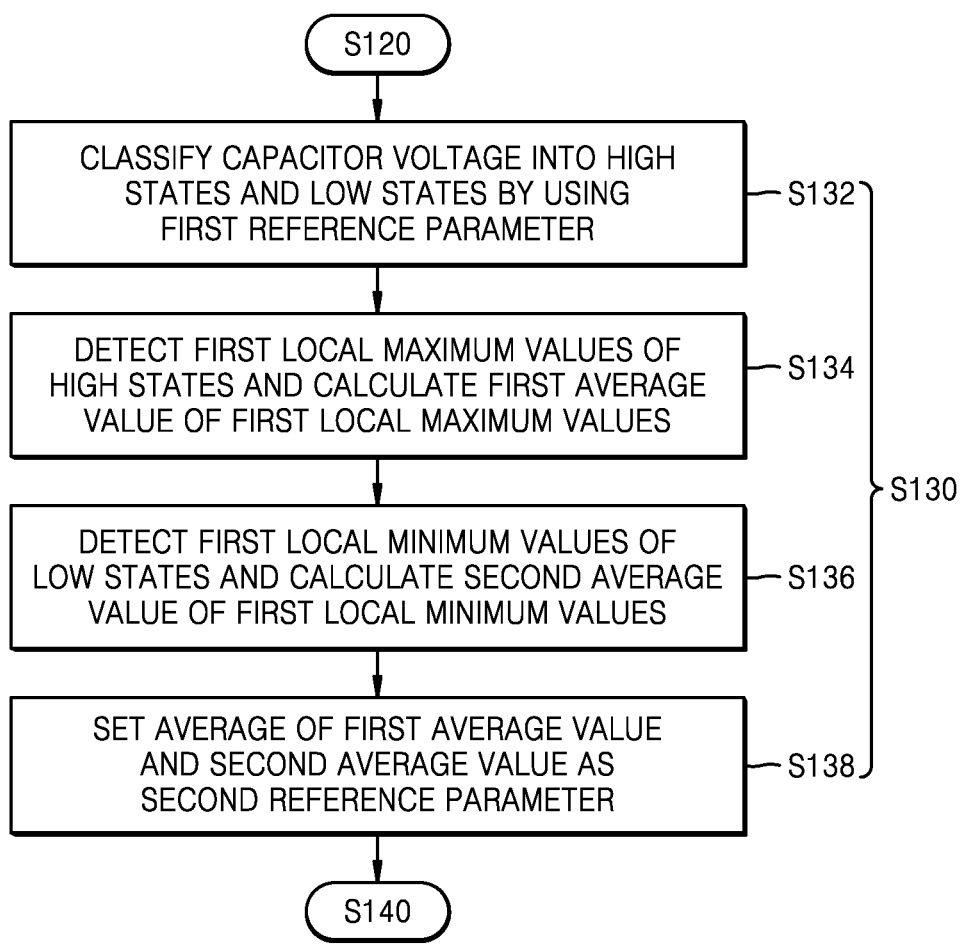
FIG. 4 is a detailed flowchart of an operation of setting a second reference parameter in the monitoring method of a secondary power device of FIG. 1.

FIG. 2 is a graph showing a detailed process of the monitoring method of a secondary power device of FIG. 1. FIG. 3 is a detailed flowchart of an operation of setting a first reference parameter in the monitoring method of a secondary power device of FIG. 1. FIG. 4 is a detailed flowchart of an operation of setting a second reference parameter in the monitoring method of a secondary power device of FIG. 1. For better understanding, FIG. 10 will also be referred to in the description.

Referring to FIGS. 2 and 3, when power is on (P-On), charging to capacitors 210 of secondary power device 200 may be started. Next, charging is conducted until a set level, and after delay of a certain period of time from a start time t0 at which a full-charge signal is received, a first reference parameter Par1 may be set in a first calibration section or interval ($1^{st}$ Calibration) from a time t1 to a second time t2.

A voltage of capacitor 210 may have a ripple shape as illustrated by a charging operation of charging unit 300. In other words, the voltage of capacitor 210 may be charged to a certain voltage via charging of charging unit 300, and then the voltage decreases via natural discharging to drop below the certain voltage, and here the voltage of capacitor 210 is charged again by charging unit 300. In this manner, the voltage of capacitor 210 may have a ripple shape. The first calibration section or interval ($1^{st}$ Calibration) may be set to include several to several tens of voltage ripples of capacitor 210.

The first reference parameter Par1 may be set through the following process.

Voltage measuring unit 110 repeatedly or continuously measures a voltage of capacitor 210, and detects a maximum value Max of the voltage of capacitor 210 in the first calibration section or interval ($1^{st}$ Calibration) via comparison logic. Also, voltage measuring unit 110 detects a minimum value Min of the voltage of capacitor in the first calibration section or interval ($1^{St}$ Calibration) via comparison logic (S124). A plurality of ripples may include a plurality of local maximum values and a plurality of local minimum values. A local maximum value and a local minimum value may respectively indicate a maximum voltage and a minimum voltage in one ripple. Thus, the maximum value Max may be the greatest among a plurality of local maximum values, and the minimum value Min may be the smallest among a plurality of local minimum values. Operation of detecting a maximum value (S122) and operation of detecting a minimum value (S124) may be performed in an arbitrary order. In addition, operation of detecting a maximum value (S122) and operation of detecting a minimum value (S124) may be performed in combination.

Next, an average of the maximum value Max and the minimum value Min is set as a first reference parameter Par1 (S126). In the first calibration section or interval ($1^{st}$ Calibration) of FIG. 2, a dotted central line may correspond to the first reference parameter Par1. The first reference parameter Par1 may be set to extract local maximum values and local minimum values in a next, second calibration section or interval ($2^{nd}$ Calibration).

Referring to FIGS. 2 and 4, after setting the first reference parameter Par1, in the second calibration section or interval ($2^{nd}$ Calibration) from the second time t2 to a third time t3, a second reference parameter Par2 may be set. The second calibration section or interval ($2^{nd}$ Calibration) may be set to include several to several tens of voltage ripples of capacitor 210 in the second calibration section or interval ($2^{nd}$ Calibration). According to an embodiment, there may be a delay time between the first calibration section or interval ($1^{st}$ Calibration) and the second calibration section or interval ($2^{nd}$ Calibration).

The second reference parameter Par2 may be set through a following process.

A voltage of capacitor 210 in the second calibration section or interval ($2^{nd}$ Calibration) is classified as a high state or a low state by using the first reference parameter Par1 (S132). In other words, a section or interval where the voltage is equal to or higher than the first reference parameter Par1 is set as a high state section or interval, and a section or interval where the voltage is less than the first reference parameter Par1 is set as a low state section or interval. The second calibration section or interval ($2^{nd}$ Calibration) may be classified into multiple high state sections or intervals and multiple low state sections or intervals through this classification based on the first reference parameter Par1.

Next, first local maximum values of high state sections or intervals may be detected, and a first average value Max Points AVG which is an average of the first local maximum values may be calculated (S134). Each of the first local maximum values may be detected by applying comparison logic to the voltage measurements of each of the high state sections or intervals. In addition, first local minimum values of low state sections or intervals may be detected, and a second average value Min Points AVG which is an average of the first local minimum values may be calculated (S136). Each of the first local minimum values may be detected by applying comparison logic to the voltage measurements of each of the low state sections or intervals. In the second calibration section or interval ($2^{nd}$ Calibration) of FIG. 2, a thin upper elliptic curve may cover an area of the first local maximum values, and a thin lower elliptic curve may cover an area of the first local minimum values.

An operation (S134) of calculating a first average value Max Points AVG and an operation (S136) of calculating a second average value Min Points AVG may be performed in an arbitrary order. In addition, classifying sections or intervals into high state intervals and low state intervals (S132), an operation of calculating a first average value (S134), and an operation of calculating a second average value (S136) may be performed in combination. For example, a voltage of capacitor 210 measured using voltage measuring unit 110 may be classified into a high state section or interval or a low state section or interval by comparing the same with the first reference parameter Par1, and also, a local maximum value or a local minimum value may be detected in each of the high state sections or intervals and each of low state sections or intervals through comparison logic.

Next, an average of the first average value Max Points AVG and the second average value Min Points AVG is set as a second reference parameter Par2 (S138). In the second calibration section or interval (2nd Calibration) of FIG. 2, a dotted central line may correspond to the second reference parameter Par2.

After setting the second reference parameter Par2, in a reference level setup & monitoring section or interval (RL setup & Monitoring) after the third time t3, setting of the reference level RL and monitoring of secondary power device 200 may be performed. The reference level RL may be set by using the second reference parameter Par2. For example, the reference level RL may be set as a range of $\pm\Delta$ in which the second reference parameter Par2 is a central value. Setting of the reference level RL will be described in more detail with reference to FIGS. 5A and 5B.

Monitoring of secondary power device 200 may be performed by measuring a discharging time DCHt of capacitor 210 by using the reference level RL and determining whether secondary power device 200 is in a normal state by comparing the discharging time DCHt with a reference time Rt. Monitoring will be described in more detail with reference to FIGS. 6A through 7.

FIGS. 5A and 5B are detailed graphs for describing an operation of setting a reference level in the monitoring method of a secondary power device of FIG. 1.

Referring to FIG. 5A, a reference level RL1 may be set to be in a range of $\pm\Delta1$ in which the second reference parameter Par2 is a central value. That is, the reference level RL1 may be set to be in a range from 'Par2−Δ1' to 'Par2+Δ1'. Here, Δ1 may be a fixed value. As Δ1 is a fixed value, regardless of a ripple height of a voltage of capacitor 210, the reference level RL1 may have a uniform height. Here, a ripple size may be defined, for example, as a difference between the first average value and the second average value. For example, it may be assumed that a voltage of capacitor 210 has a central value of 25 V which corresponds to the second reference parameter Par2 and a ripple size of 1 V, and Δ1 is set to a fixed value of 0.3 V. The reference level RL1 may be set to a range of 25±0.3 V. On the other hand, it may be assumed that a voltage of capacitor 210 has a central value of 25 V corresponding to the second reference parameter Par2 and a ripple size of 2 V. Then, as Δ1 fixed to 0.3 V, the reference level RL1 may still be set to a range of 25±0.3 V.

Referring to FIG. 5B, a reference level RL2 may be set to a range of $\pm\Delta2$ in which the second reference parameter Par2 is a central value. Δ2 may be a value that proportionally varies in conjunction with a particular value. For example, Δ2 may be set to a percentage (%) with respect to a difference between the first average value and the second average value above, that is, with respect to a ripple size.

For example, it may be assumed that a voltage of capacitor 210 has a central value of 25 V corresponding to the second reference parameter Par2 of 25 V and a ripple size of 1 V, and Δ2 is set to a variation value of 30% of the ripple size. Δ2 may be 0.3 V, and the reference level RL2 may be set to a range of 25±0.3 V. Meanwhile, it may be assumed that a voltage of capacitor 210 has a central value of 25 V corresponding to the second reference parameter Par2 and a ripple size of 2 V. Then, Δ2 is 0.6 V, and the reference level RL2 may be set to a range of 25±0.6 V.

Figure 6A:
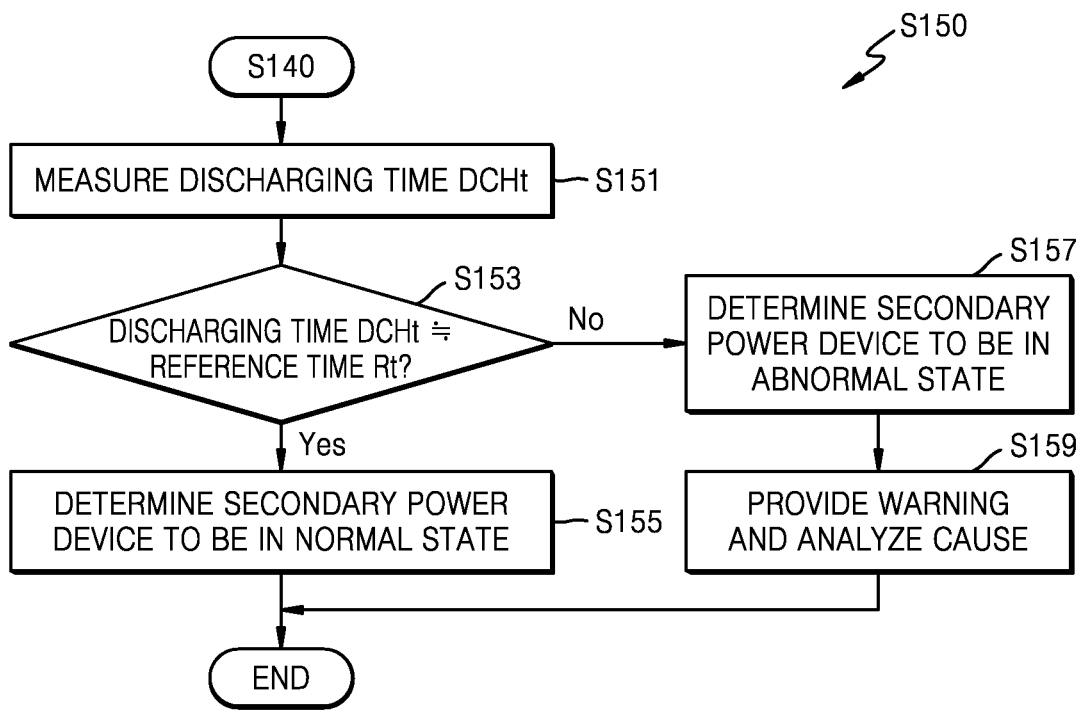
FIGS. 6A and 6B are detailed flowcharts of an operation of monitoring a secondary power device in the monitoring method of a secondary power device of FIG. 1.
Figure 6B:
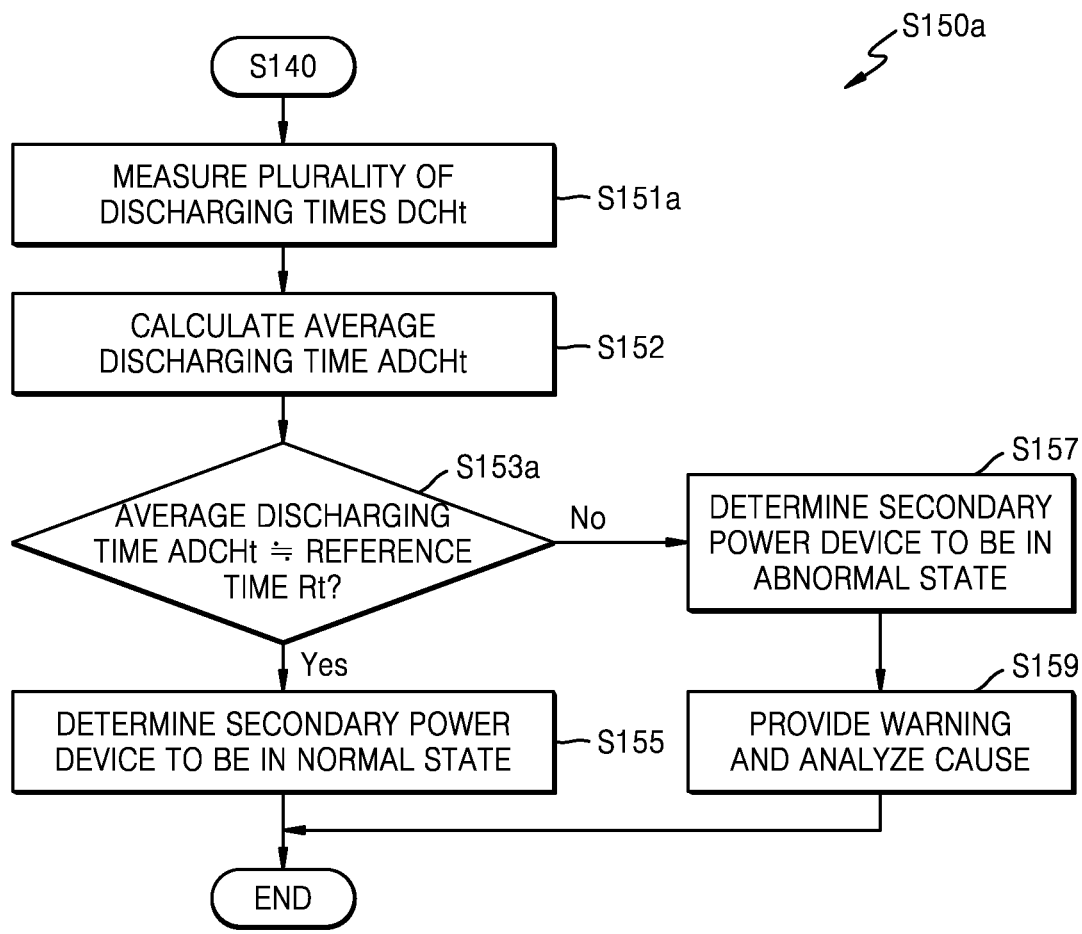
Figure 7:
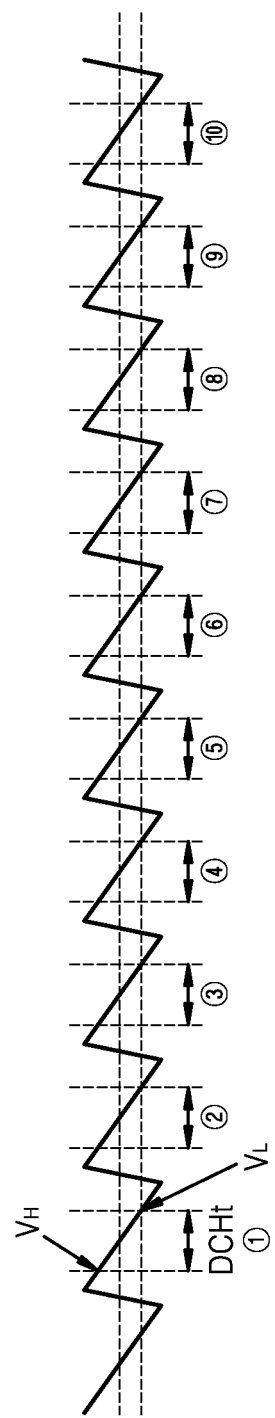
FIG. 7 is a detailed graph of an operation of monitoring a secondary power device of FIG. 6B.

FIGS. 6A and 6B are detailed flowcharts of an operation of monitoring a secondary power device in the monitoring method of a secondary power device of FIG. 1. FIG. 7 is a detailed graph of an operation of monitoring a secondary power device of FIG. 6B. For better understanding, FIGS. 2 and 10 will also be referred here.

Referring to FIG. 6A, first, a discharging time DCHt of capacitor 210 is measured by using the reference level RL (S151). The discharging time DCHt of capacitor 210 may refer to a time during which a voltage of capacitor 210 drops from a high voltage $V_H$ to a low voltage $V_L$ of the reference level RL. The high voltage $V_H$ of the reference level RL may correspond to 'the second reference parameter Par2+Δ', and the low voltage $V_L$ may correspond to 'the second reference parameter Par2−Δ'.

Next, whether the discharging time DCHt of capacitor 210 is equal to the reference time Rt within a set error range is determined (S153). The mark '≈' may indicate that the discharging time DCHt of capacitor 210 is equal to the reference time Rt within a set error range. For example, when a set error rage is ±5%, and a difference between the discharging time DCHt of capacitor 210 and the reference time Rt is within ±5%, then the discharging time DCHt of capacitor 210 may be determined to be equal to the reference time Rt within a set error range; when a difference between the discharging time DCHt of capacitor 210 and the reference time Rt exceeds ±5%, the discharging time DCHt of capacitor 210 and the reference time Rt may be determined as unequal. In detail, for example, when a reference time is 3 ms, and the discharging time DCHt of capacitor 210 is within a range from about 2.95 ms to about 3.05 ms, the discharging time DCHt of capacitor 210 and the reference time Rt may be determined as equal; when the discharging time DCHt of capacitor 210 is outside the range from 2.95 ms to 3.05 ms, the discharging time DCHt of capacitor 210 and the reference time Rt may be determined as unequal. The set range is not limited to ±5%. For example, when precise determination is required, the set range may be set to be less than ±5%.

When the discharging time DCHt of capacitor 210 and the reference time Rt are equal within a set error range (Yes), secondary power device 200 is determined to be in a normal state (S155).

When the discharging time DCHt of capacitor 210 and the reference time Rt are not equal within a set error range (No), secondary power device 200 is determined to be in an abnormal state (S157). Next, an alarm message or a warning signal is sent to warn about the abnormal state of secondary power device 200 and the cause of the abnormal state is analyzed (S159). According to an embodiment, operation of warning and cause analysis (S159) may include an operation of calibrating charging unit 300 to maintain secondary power device 200 in a normal state as much as possible or an operation of repairing or replacing secondary power device 200.

Referring to FIGS. 6B and 7, first, a discharging time DCHt of a plurality of capacitors 210 is measured by using the reference level RL (S151a). The discharging time DCHt of capacitors 210 may be continuously measured with respect to each of voltage ripples of capacitors 210 as illustrated in FIG. 7. However, according to an embodiment, the discharging times DCHt of capacitors 210 may also be intermittently measured with respect to ripples of voltages of capacitors 210. While ten discharging times DCHt of capacitors 210 are measured in FIG. 7, the number of discharging times DCHt being measured is not limited thereto.

Next, an average discharging time ADCHt is calculated with respect to the plurality of discharging times DCHt of capacitors 210 (S152). In addition, whether the calculated average discharging time ADCHt is equal to the reference time Rt within a set error range is determined (S153a). Determining whether the calculated average discharging time ADCHt is equal to the reference time Rt within a set error range is as described with reference to the embodiment of FIG. 6A. In addition, operations (S155), (S157) and (S159) after the determination (S153a) are the same as those described with reference to the embodiment of FIG. 6A.

For reference, when using the plurality of discharging times DCHt of capacitors 210 in monitoring secondary power device 200, accuracy in checking of the state of secondary power device 200 may be increased. For example, even if secondary power device 200 is in a normal state, some factors may cause a voltage form of capacitor 210 to appear as abnormal in a certain section or interval, and accordingly, a discharging time DCHt of capacitor 210 may also appear as abnormal. When, by chance, a discharging time DCHt of capacitor 210 is measured with respect to the above section or interval and used in checking the state of secondary power device 200, an error in which secondary power device 200 is indicated to be abnormal even though secondary power device 200 is in a normal state may occur. On the other hand, when several discharging times DCHt of capacitors 210 are measured and an average discharging time ADCHt thereof is used in monitoring secondary power device 200, errors in checking of the state of secondary power device 200 may be remarkably reduced.

Figure 8:
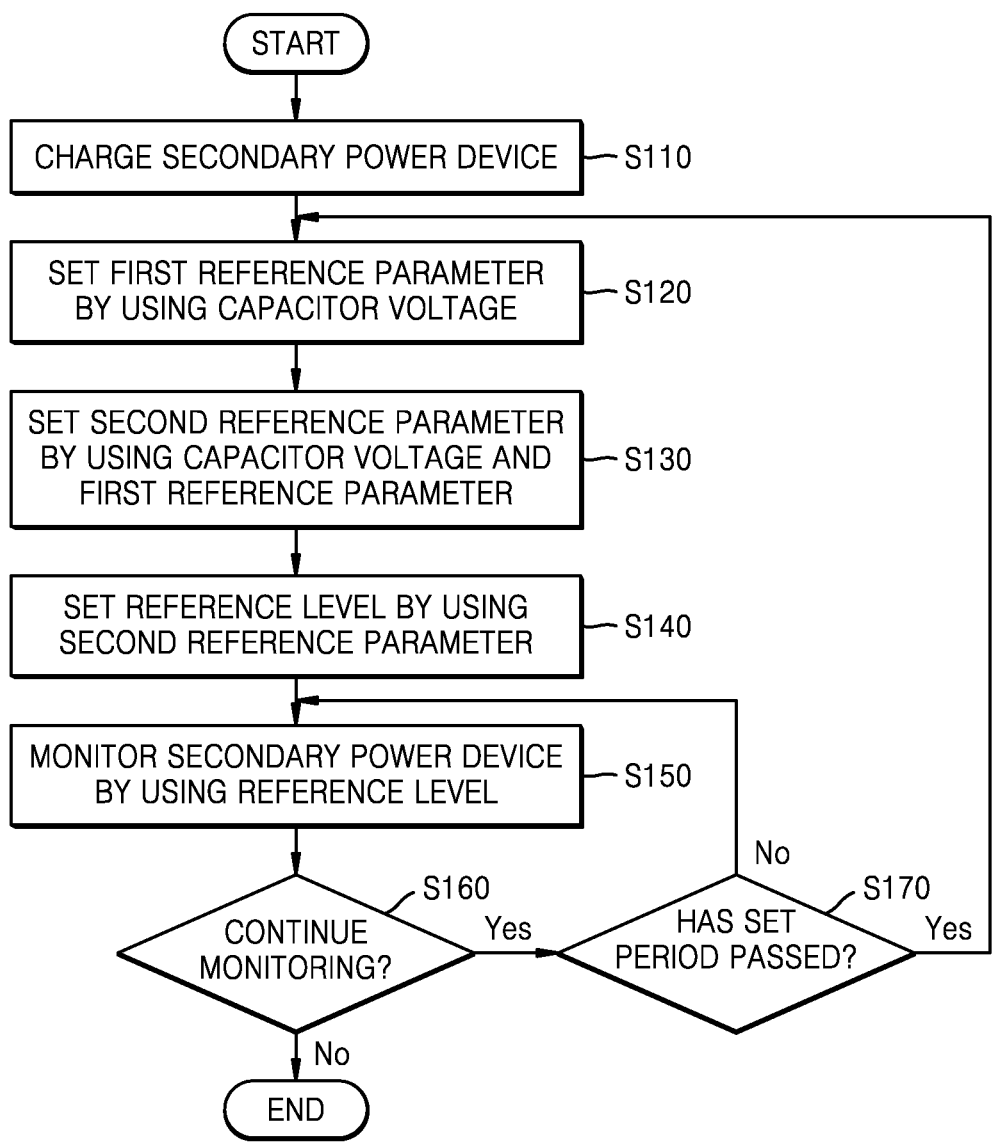
FIG. 8 and FIG. 9 are schematic flowcharts of embodiments of a monitoring method of a secondary power device.
Figure 9:
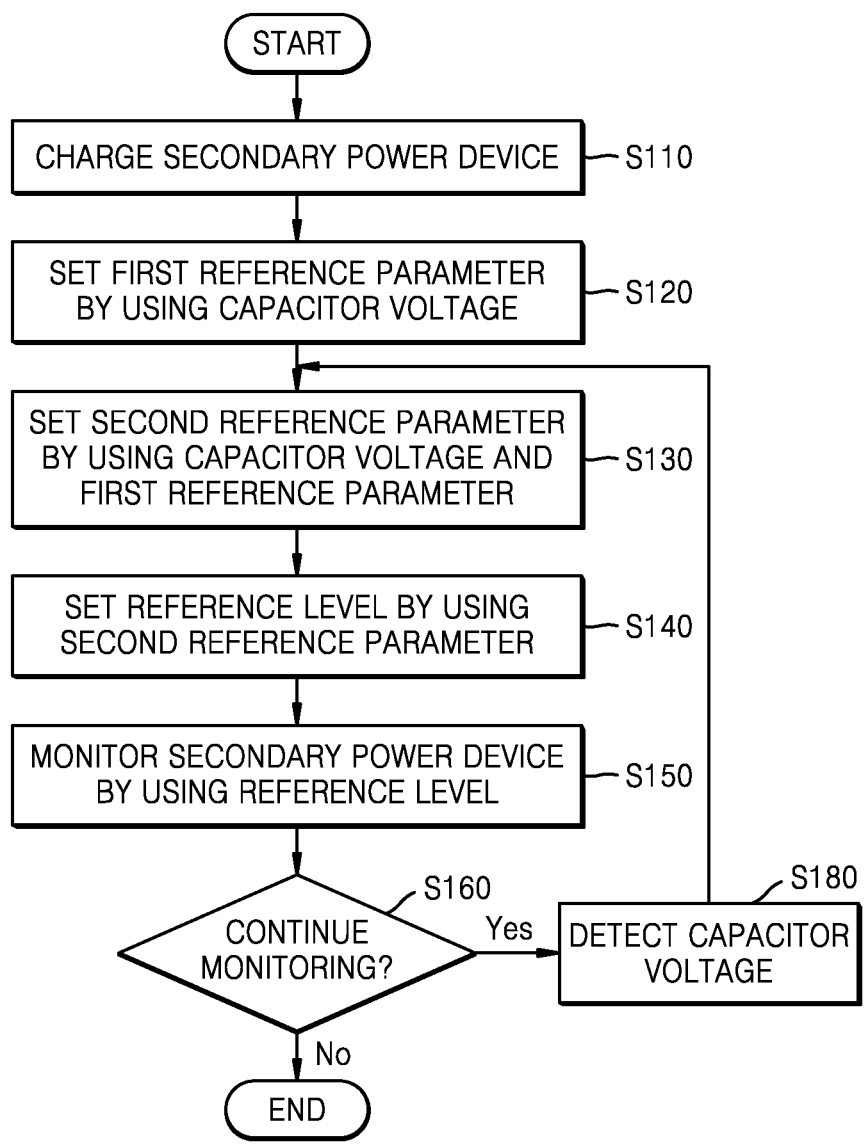

FIGS. 8 and 9 are schematic flowcharts of embodiments of a monitoring method of a secondary power device. The monitoring methods will be described also by referring to FIG. 10, a description of which has already been provided above with reference to FIGS. 1 through 7 and therefore will be provided briefly or omitted here.

Referring to FIG. 8, in the present embodiment of a monitoring method of a secondary power device, operations from operation S110 of charging the secondary power device to operation S150 of monitoring the secondary power device are performed as described above with reference to FIG. 1. Description of each operation is as provided above in the description with reference to FIG. 1.

Next, whether to continue monitoring is determined (S160). When stopping monitoring (No), the monitoring method of the secondary power device is ended.

When continuing monitoring (Yes), whether a set period of time has passed is determined (S170). When a set period has passed (Yes), operation S120 of setting a first reference parameter is performed again. According to an embodiment, the method may proceed to operation S110 of charging the secondary power device.

When a set period of time has not passed (No), operation S150 of monitoring the secondary power device is performed. By periodically performing resetting of the first and second reference parameters Par1 and Par2 again, and then resetting a reference level RL according to the reset first and second parameters Par1 and Par2, reliability of monitoring of the secondary power device may be increased.

Referring to FIG. 9, according to the present embodiment of a monitoring method of the secondary power device, operations from operation S110 of charging the secondary power device to operation S150 of monitoring the secondary power device are performed as described above with reference to FIG. 1. Description of each operation is as provided above in the description with reference to FIG. 1.

Next, whether to continue monitoring is determined (S160). When stopping monitoring (No), the monitoring method of the secondary power device is ended.

When continuing monitoring (Yes), a voltage of capacitor 210 is detected (S180). Next, the method proceeds to operation S130 of setting a second reference parameter Par2 again. Meanwhile, in operation S130 of resetting a second reference parameter, a newly detected voltage may be used in setting the second reference parameter Par2.

According to the monitoring method of the secondary power device of the present embodiment, after setting the reference level RL, as a measured voltage of capacitor 210 is used in resetting the second reference parameter Par2 and resetting the reference level RL according to the second reference parameter Par2, the reference level RL may be calibrated in real time based on the voltage of capacitor 210, and the reference level RL may be used in checking of the state of secondary power device 200. Accordingly, accuracy of checking of the state of secondary power device 200 may be further increased according to the monitoring method of the secondary power device of the present embodiment.

Figure 10:
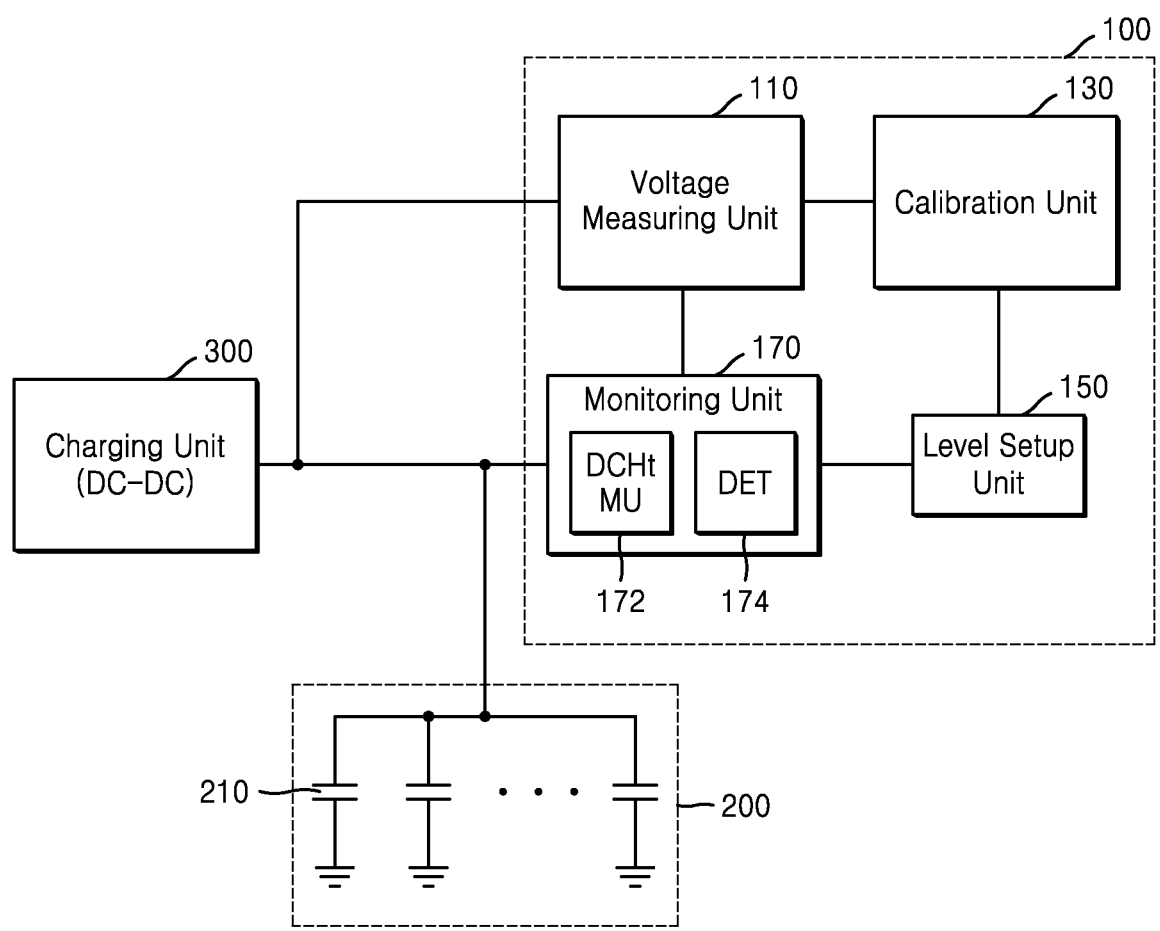
FIG. 10 is a schematic structural block diagram of an embodiment of a monitoring apparatus of a secondary power device.

FIG. 10 is a schematic structural block diagram of an embodiment of a monitoring apparatus of a secondary power device.

Referring to FIG. 10, monitoring apparatus 100 of a secondary power device (hereinafter referred to as 'monitoring apparatus') according to the present embodiment may include a voltage measuring unit 110, a calibration unit 130, a level setup unit 150, and a monitoring unit 170. Monitoring apparatus 100 may perform monitoring to check the state of a secondary power device 200.

Before describing monitoring apparatus 100, secondary power device 200, which is to be monitored, and charging unit 300 will be described.

When a sudden power-off (SPO) occurs, in which an external power supply which is to supply power to an electronic system, for example, a memory system, is interrupted, secondary power device 200 supplies energy accumulated in secondary power device 200 to the electronic system (e.g., memory system) to allow an ongoing operation to be completed and data to be backed up. However, when a defect is caused in secondary power device 200, a rated power level is not supplied to the memory system in the situation of SPO, and accordingly, serious data loss may be caused in the memory system. Consequently, to prevent data loss of the memory system in an SPO situation, secondary power device 200 is to be monitored periodically or in real time to check the state of secondary power device 200, and when a defect is present, secondary power device 200 may have to be repaired or replaced. Secondary power device 200 may include at least two capacitors 210 connected in parallel to each other as illustrated in FIG. 10. However, secondary power device 200 is not limited to the parallel structure of capacitors 210, and capacitors 210 of secondary power device 200 may also be arranged in a serial structure or a serial-parallel structure.

Charging unit 300 may supply power to secondary power device 200 to charge capacitors 210. When a charge is accumulated in capacitors 210 via charging by charging unit 300 and thus a voltage of capacitors 210 reaches a set high voltage, charging by charging unit 300 is stopped. When charging is stopped, natural discharging occurs where charges drain from capacitors 210 little by little, and accordingly, the voltage of capacitors 210 decreases gradually. The voltage of capacitors 210 continues decreasing until a set low voltage is reached, and then a charging operation of charging unit 300 is resumed and charging in capacitors 210 of secondary power device 200 is performed again.

The charging operation of charging unit 300 is repeatedly performed during a certain period when secondary power device 200 is in a normal state, and accordingly, a voltage of capacitors 210 may have a form that ripples between a high voltage and a low voltage. However, when secondary power device 200 is in an abnormal state, for example, when a defect such as a short or an open has occurred in some of capacitors 210 of secondary power device 200, a voltage of capacitors 210 has a different form from that of capacitors 210 in a normal state.

In detail, for example, when capacitors 210 are in a normal state, a voltage of capacitors 210 may periodically alternate between a high voltage and a low voltage with a discharging time T1 and a charging time T2. When an open defect which is an abnormal state occurs in capacitors 210, natural discharging may be slowed and a discharging time may be longer than the discharging time T1. According to circumstances, when an open defect occurs in capacitors 210, the discharging time may be shorter than the discharging time T1. Meanwhile, when a short defect which is an abnormal state occurred in capacitors 210, the charge of capacitor 210 may be quickly discharged and the discharging time may be far shorter than the discharging time T1. When a short defect occurs, charges are not accumulated in capacitors 210 and thus a voltage of capacitor 210 decreases continuously and ultimately to a ground state.

Accordingly, by measuring a discharging time of capacitors 210 of secondary power device 200 and analyzing the same, a state of secondary power device 200 may be may be determined. Meanwhile, a charging operation of secondary power device 200 in charging unit 300 is performed by using a DC-DC converter, and this will be described in more detail with reference to FIGS. 11A and 11B.

Voltage measuring unit 110 may measure a voltage of capacitors 210 of secondary power device 200. Due to limited memory capacity, not all measurements of the voltage of capacitors 210 measured using voltage measuring unit 110 are stored and processed, but only those voltages corresponding to certain conditions may be stored and processed. For example, as described above regarding the monitoring method of secondary power device 200, a maximum value and a minimum value of a voltage of capacitors 210 may be detected in a first calibration section or interval ($1^{st}$ Calibration) via comparison logic, and local maximum values and local minimum values of the voltage of capacitors 210 may be detected in a second calibration section or interval ($2^{nd}$ Calibration). In a reference level setup and monitoring section or interval (RL Setup & Monitoring), a voltage of capacitors 210 may be used in detecting a discharging time DCHt by comparing the voltage of capacitors 210 with a reference level RL. In addition, a voltage of capacitors 210 of the reference level setup and monitoring section (RL Setup & Monitoring) may be used in newly setting a second reference parameter Par2 as described above with reference to the monitoring method of secondary power device 200 of FIG. 9.

Calibration unit 130 may set a first reference parameter Par1 and a second reference parameter Par2 based on a voltage of capacitor 210 of secondary power device 200 detected using voltage measuring unit 110. A method of setting the first reference parameter Par1 and the second reference parameter Par2 is as described in the description with reference to FIGS. 2 through 4.

Level setup unit 150 may set a reference level RL for checking of the state of secondary power device 200 by using the second reference parameter Par2 set using calibration unit 130. A method of setting the reference level RL is as described in the description with reference to FIGS. 5A and 5B.

Monitoring unit 170 may check a state of secondary power device 200 by detecting a discharging time of capacitor 210 of secondary power device 200 by using the reference level RL set using level setup unit 150. Monitoring unit 170 may include a discharging time detecting unit 172 (DCHt MU) and a determining unit 174 (DET).

Discharging time detecting unit 172 may detect a discharging time DCHt of capacitor 210 of secondary power device 200 by using the reference level RL. For example, discharging time detecting unit 172 may detect a discharging time DCHt during which a voltage of capacitor 210 is discharged from a high voltage $V_H$ to a low voltage $V_L$ of the reference level RL. Determining unit 174 may determine a state of secondary power device 200 by comparing the discharging time DCHt with a reference time Rt. Detection of a discharging time and checking of the state of secondary power device 200 performed by monitoring unit 170 are as described above in the description with reference to FIGS. 6A through 7.

Monitoring apparatus 100 according to the present embodiment automatically sets a reference level for checking the state of secondary power device 200 according to the above-described process, and may use the reference level in checking the state of secondary power device 200, thereby preventing an error in checking of the state of secondary power device 200 which may occur due to sample variation or a temperature change. In addition, as the reference level is calibrated continuously in real time, secondary power device 200 is monitored in real time, thereby minimizing an error rate of checking the state of secondary power device 200.

Figure 11A:
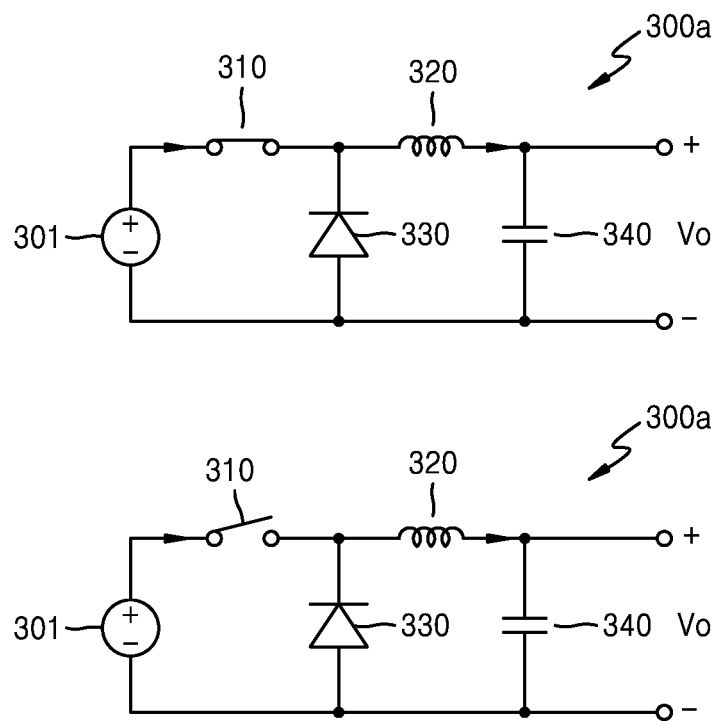
FIGS. 11A and 11B are detailed circuit diagrams of a DC-DC converter portion of a charging unit of the monitoring apparatus of a secondary power device of FIG. 10.
Figure 11B:
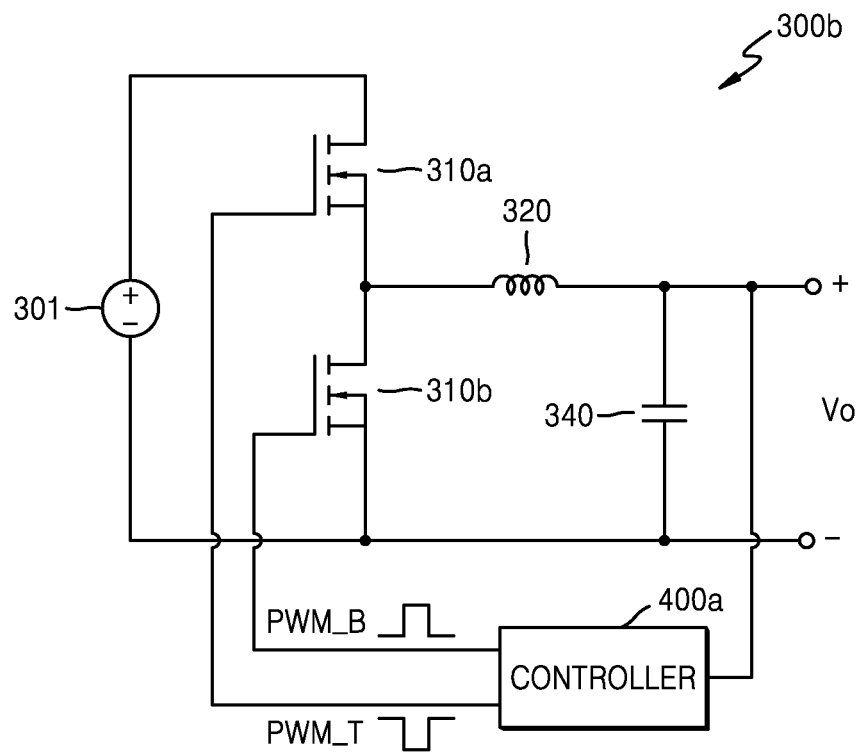

FIGS. 11A and 11B are detailed circuit diagrams of a DC-DC converter portion of charging unit 300 of monitoring apparatus 100 of secondary power device 200 of FIG. 10.

Referring to FIGS. 11A and 11B, in monitoring apparatus 100 according to the present embodiment, charging unit 300 charging secondary power device 200 may include a DC-DC converter. However, charging unit 300 is not limited to a DC-DC converter. For example, a buffer circuit including a switching element may also be used as charging unit 300.

A DC-DC converter is typically classified as a boost converter or a buck converter. A boost converter boosts an input DC voltage level and outputs DC power with a boosted DC voltage level which is greater than the input DC voltage level, and a buck converter reduces an input DC voltage level and outputs DC power with a DC voltage which is less than the input DC voltage level. As illustrated in FIG. 11A, charging unit 300 may include a buck converter 300a, and buck converter 300a may include a switch 310, an inductor 320, a diode 330, and a capacitor 340. For reference, capacitor 340 may be included in buck converter 300a as illustrated in FIG. 11A. However, capacitor 340 may also be treated as a portion of secondary power device 200 which is to be charged.

An example operation of buck converter 300b will be described briefly. When switch 310 is closed as illustrated in an upper portion of FIG. 11A, a current is applied from a power supply 301 to inductor 320, thereby increasing a current flowing through inductor 320 and accumulating energy in inductor 320 accordingly. The energy is transferred to an output end to increase an output voltage Vo, that is, a voltage of capacitor 340. Here, diode 330 is inversely biased, and thus no current flows to diode 330. Next, as illustrated in a lower portion of FIG. 11A, when switch 310 is opened, a closed circuit is formed via inductor 320, diode 330, and capacitor 340. Here, a current flowing through inductor 320 gradually decreases through the closed circuit, and accordingly, the output voltage Vo, that is, a voltage of capacitor 340 is reduced. This may correspond to natural discharging in terms of capacitor 340. Meanwhile, an average voltage of the output voltage Vo may be controlled based on a ratio of the times that switch 310 is closed and opened. In addition, a maximum output voltage may be reached when switch 310 is closed, and the output voltage level may always be equal to or less than the input voltage level from power supply 301. Switch 310 may be formed of a field effect transistor (FET) which is easy to control. Control of switch 310 will be described in further detail when describing a buck converter 300b of FIG. 11B.

As illustrated in FIG. 11B, buck converter 300b may include a pair of switches 310a and 310b, an inductor 320, and a capacitor 340. Switches 310a and 310b may be both an n-type FET as illustrated in FIG. 11B, but are not limited thereto. For example, pair of switches 310a and 310b may respectively be an N-type FET and a P-type FET, and when switches 310a and 310b are in such a combination, an identical pulse width modulation (PWM) signal may be input to each of switches 310 and 310b.

An operation of buck converter 300b will be described briefly. Buck converter 300b may operate in two different modes based on an on/off state of switches 310a and 310b. For example, a first mode is an operating mode in which first switch 310a is turned on and second switch 310b is turned off, and as a current is applied from power supply 301 to inductor 320, more current flows through inductor 320, and accordingly, energy is accumulated in inductor 320, and the energy is transferred to an output end to thereby increase the output voltage Vo, that is, a voltage of capacitor 340. A second mode is an operating mode in which first switch 310a is turned off and second switch 310b is turned on, and a closed circuit is formed via inductor 320 and capacitor 340. A current flowing through inductor 320 flows through the closed circuit until first switch 310a is turned on in a next period, gradually decreasing. Thus, the output voltage Vo is reduced.

On the basis of this principle, a controller 400a senses the output voltage Vo, and when the output voltage Vo is relatively low, a conduction period of first switch 310a may be increased and a conduction period of second switch 310b may be reduced, to thereby increase the output voltage Vo. In addition, when the output voltage Vo is high, a conduction period of first switch 310a may be reduced and a conduction period of second switch 310b may be increased to thereby reduce the output voltage Vo. For example, as controller 400a adjusts a duty ratio of a PWM signal output to each of first switch 310a and second switch 310b based on the output voltage Vo, a voltage in a certain range may be maintained in capacitor 340.

Figure 12A:
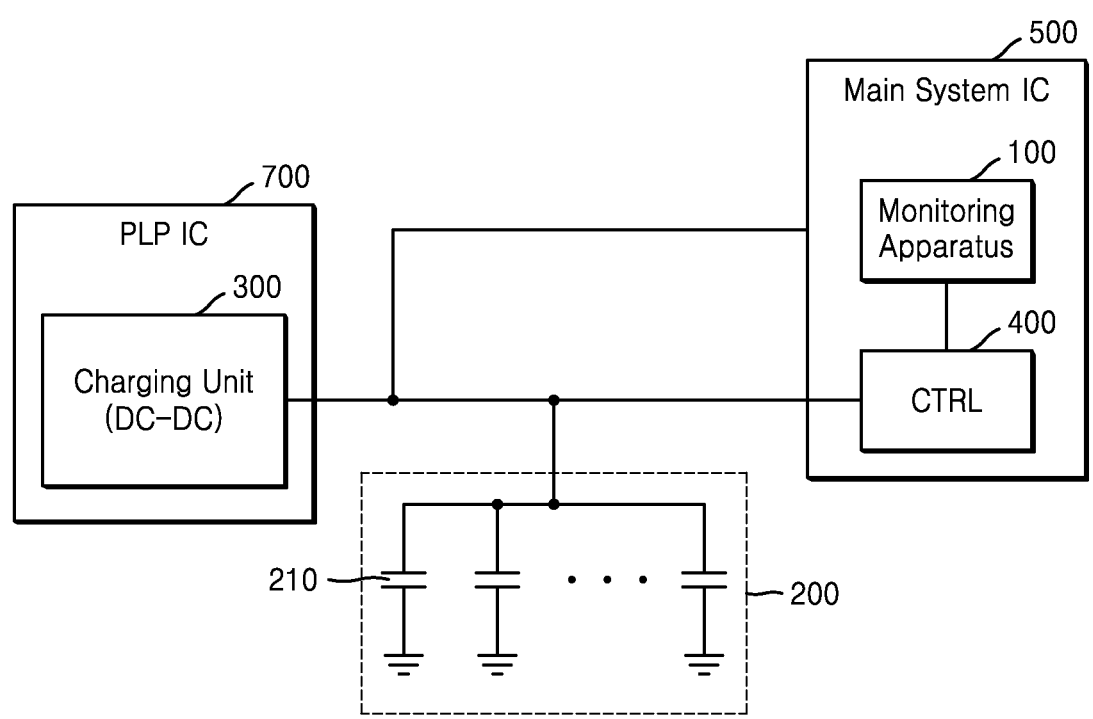
FIGS. 12A and 12B are structural block diagrams illustrating a location where the monitoring apparatus of FIG. 10 is arranged in an electronic system including a secondary power device.
Figure 12B:
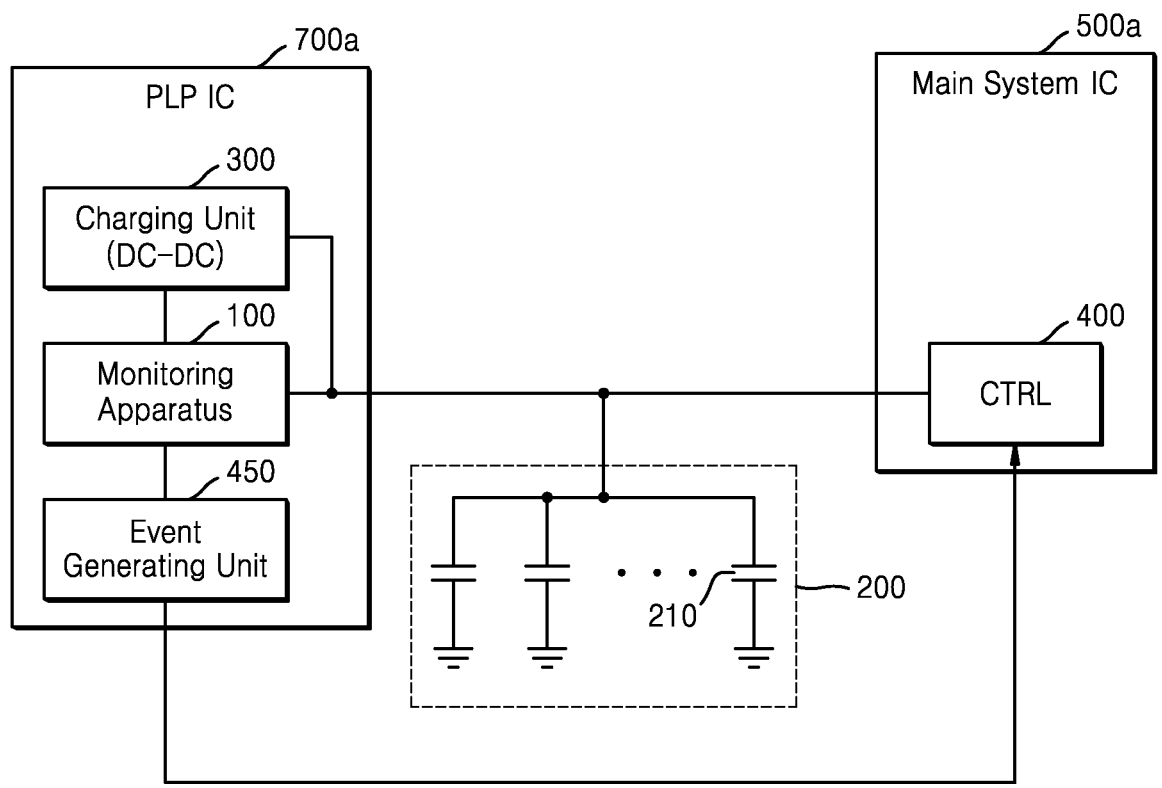

FIGS. 12A and 12B are structural block diagrams illustrating a location where monitoring apparatus 100 of FIG. 10 is arranged in an electronic system including a secondary power device.

Referring to FIG. 12A, monitoring apparatus 100 according to the present embodiment may be integrated in a main system integrated circuit (IC) 500 or a main system block together with a controller 400. Secondary power device 200 and charging unit 300 may be arranged in a power loss protection (PLP) IC 700 or a PLP block. As monitoring apparatus 100 is arranged in main system IC 500, the state of secondary power device 200 may be monitored and information about the state of secondary power device 200 may be immediately transferred to controller 400. Accordingly, control of charging unit 300 via controller 400 may be performed quickly.

Here, controller 400 may control charging unit 300 based on a result received from monitoring apparatus 100. For example, in the event of a defect caused in secondary power device 200, control of charging unit 300 may include modifying charging conditions of charging unit 300 to maintain secondary power device 200 in a normal state as much as possible. In addition, when a defect has occurred in secondary power device 200, controller 400 may modify a memory write operating mode in an electronic system to which power is to be supplied, for example, in a memory system, and allow data to be stored in a main memory in real time. For example, when a defect is caused in secondary power device 200, controller 400 may modify a write-back (behind) mode to a write-through mode of the memory system.

For reference, a memory write operation mode may include a write-back mode and a write-through mode. In a write-back mode, data is recorded to a cache first, and data stored in the cache is recorded to a main memory only when necessary, that is, data is recorded as in a background operation by using a CPU Wait-State time of a CPU. In a write-through mode, a data write operation is performed simultaneously and in parallel both in a cache and a main memory, and the write-through mode may indicate a mode in which a data write operation is performed immediately and instantly, and not during idle time. In a write-through mode, when a data read operation on a cache is required during a write operation on the cache, a write operation and a read operation are performed as simultaneous operations. On the other hand, in a write-back mode, when a read operation is required during a write operation, the write operation is interrupted, and the write operation is resumed after the read operation is completed.

When secondary power device 200 is in a normal state, a write-back mode having a high efficiency may be typically used. However, when secondary power device 200 is in an abnormal state, data loss may be caused in a write-back mode. Thus, controller 400 may change a memory write mode to a write-through mode to minimize data loss.

Furthermore, when a defect is caused in secondary power device 200, controller 400 may generate, for example, a warning signal to notify the user so that the user should repair or replace secondary power device 200.

Referring to FIG. 12B, monitoring apparatus 100 according to the present embodiment may be arranged in a PLP IC 700*a* together with charging unit 300. When monitoring apparatus 100 is arranged in PLP IC 700*a*, PLP IC 700*a* may further include an event generating unit 450. In more detail, when monitoring apparatus 100 is arranged in PLP IC 700*a* and monitors a state of secondary power device 200, information about a state of secondary power device 200 obtained by using monitoring apparatus 100 is to be transmitted to controller 400 in a main system IC 500*a*. Accordingly, event generating unit 450 may be arranged in PLP IC 700*a*. Event generating unit 450 may transmit information about a state of secondary power device 200 as an event signal such as an interrupt signal to controller 400 of main system IC 500*a*. For example, when a defect is caused in secondary power device 200 while event generating unit 450 periodically sends a high signal to controller 400, event generating unit 450 transmits a low signal to controller 400 to thereby transmit information about a state of secondary power device 200 to controller 400.

In FIGS. 12A and 12B, although secondary power device 200 is arranged apart from PLP IC 700 or PLP IC 700*a*, this illustration is to display how secondary power device 200 is connected to monitoring apparatus 100 and controller 400, and in reality, secondary power device 200 may be arranged in PLP IC 700 or 700*a* to be included as a portion of PLP IC 700 or 700*a*. However, secondary power device 200 may also be arranged apart from PLP IC 700 or 700*a*.

Figure 13:
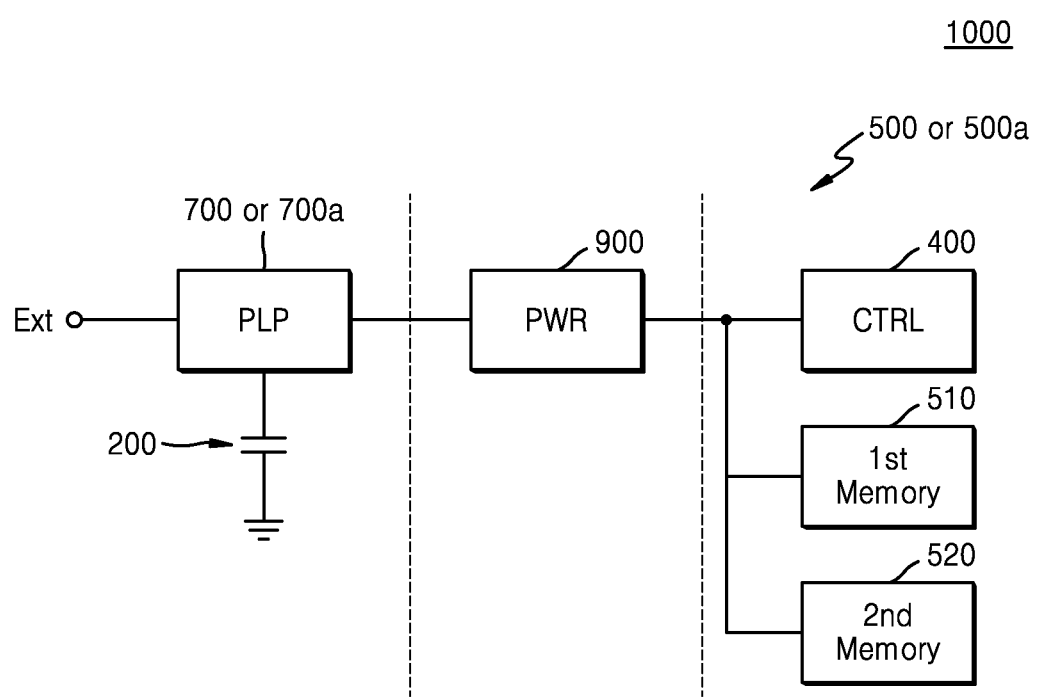
FIG. 13 is a schematic structural block diagram of an embodiment of an electronic system including a monitoring apparatus of a secondary power device.

FIG. 13 is a schematic structural block diagram of an embodiment of an electronic system 1000 including a monitoring apparatus of a secondary power device.

Referring to FIG. 13, electronic system 1000 according to the present embodiment may include PLP block or unit 700 or 700*a*, a power block or unit 900, and main system block or unit 500 or 500*a*. PLP block or unit 700 or 700*a* and main system block or unit 500 or 500*a* may refer to PLP IC 700 or 700*a* and main system IC 500 or 500*a* of FIG. 12A or 12B.

PLP block or unit 700 or 700*a* may prevent loss of power supplied to main system block or unit 500 or 500*a*. PLP block or unit 700 or 700*a* may include, for example, secondary power device 200 and/or charging unit 300. In FIG. 13, secondary power device 200 is illustrated as being arranged separately from PLP block 700 or 700*a*, which may allow an easier description of an operation of PLP block or unit 700 or 700*a* in FIGS. 14A and 14B. As described above, secondary power device 200 may be arranged in PLP block or unit 700 or 700*a* and regarded as a portion of PLP block 700 or 700*a*.

Monitoring apparatus 100 and event generating unit 450 may be arranged in PLP block or unit 700 or 700*a* as illustrated in FIG. 12B. When monitoring apparatus 100 and event generating unit 450 are arranged in PLP block or unit 700 or 700*a*, monitoring apparatus 100 may not be arranged in main system block or unit 500 or 500*a*.

Power block or unit 900 may perform a function of supplying power received from PLP block or unit 700 or 700*a*, to main system block or unit 500 or 500*a*. Power block or unit 900 may correspond to, for example, power input/output terminals of main system block or unit 500 or 500*a*.

Main system block or unit 500 or 500*a* may include a controller 400, a first memory chip 510, and a second memory chip 520. One of first memory chip 510 and second memory chip 520 may be a cache memory and the other may be a main memory. According to an embodiment, a chip corresponding to a main memory may have a multi-stack structure. According to a type of the main memory, electronic system 1000 may correspond to one of a solid state drive (SSD) module, a DRAM module, and a flash module. In an SSD module, a DRAM may be used as a cache memory, and a NAND may be used as a main memory. However, electronic system 1000 is not limited to the above-described memory modules. For example, electronic system 1000 may be any electronic device that uses a secondary power device.

Meanwhile, in electronic system 1000 according to the present embodiment, main system block 500 or 500*a* may use relatively high energy as backup energy. For example, main system block 500 or 500*a* may use an energy of 10 mJ or more as backup energy. For example, electronic system 1000 according to the present embodiment may be an SSD module in which main system block 500 or 500*a* uses energy of 10 mJ or more as backup energy. However, the type of electronic system 1000 according to the present embodiment is not limited to an SSD module.

Controller 400 may control operations of main system block 500 or 500a such as data reading, writing or erasing, in which case it may also be referred to as a memory controller. Controller 400 may also control charging unit 300 of PLP block 700 or 700a by receiving information about the state of secondary power device 200 from monitoring apparatus 100.

Monitoring apparatus 100 may be arranged in main system block 500 or 500a as illustrated in FIG. 12A. When monitoring apparatus 100 is arranged in main system block 500 or 500a, controller 400 may receive, directly from monitoring apparatus 100, information about the state of secondary power device 200. When monitoring apparatus 100 is arranged in main system block 500 or 500a, monitoring apparatus 100 and event generating unit 450 may not be arranged in PLP block 700 or 700a.

Figure 14A:
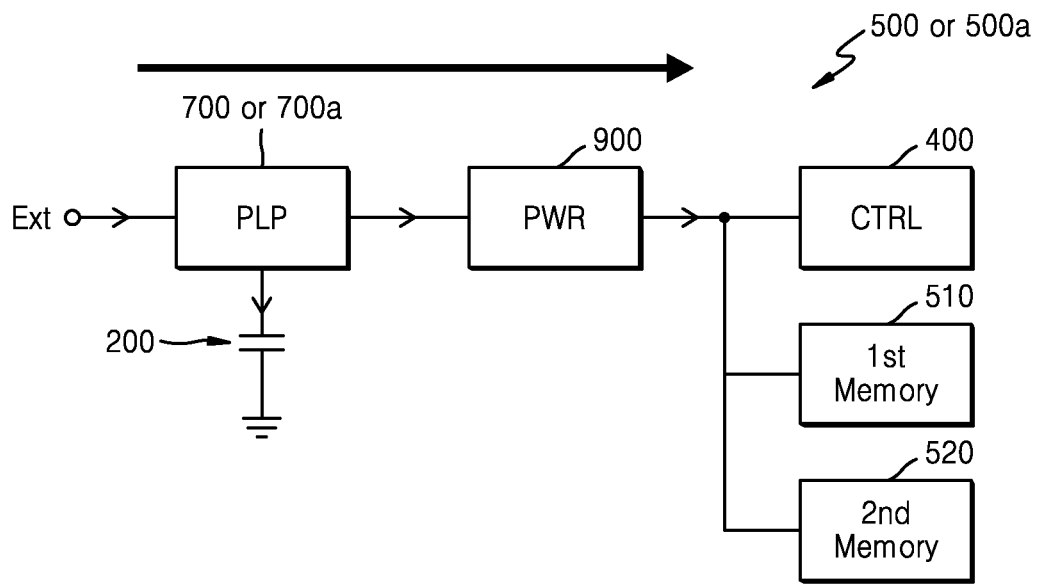
FIGS. 14A and 14B are conceptual diagrams illustrating a power supply process in the electronic system of FIG. 13.
Figure 14B:
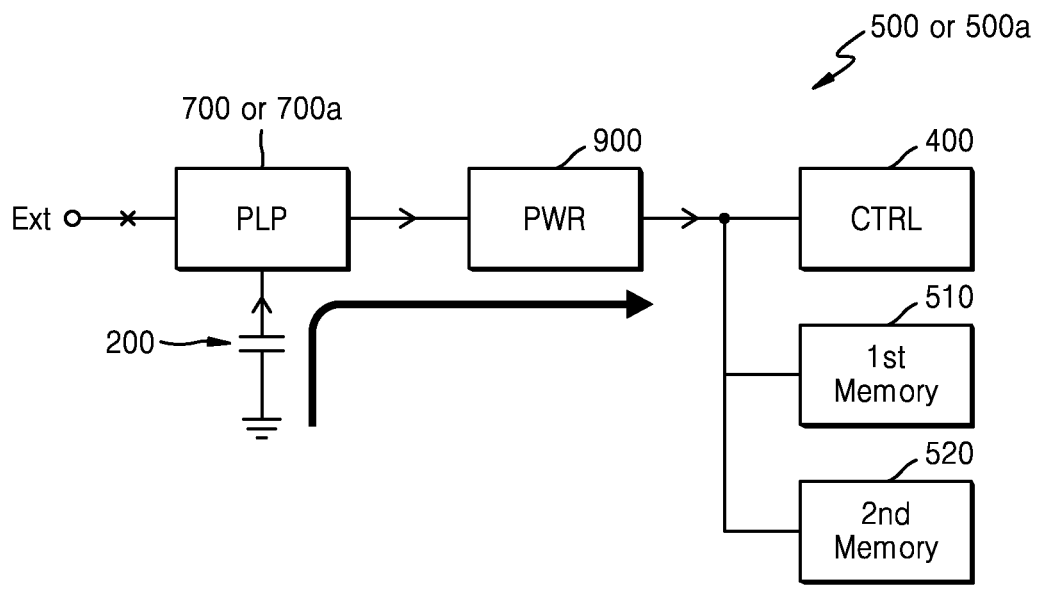

FIGS. 14A and 14B are conceptual diagrams illustrating a power supply process in electronic system 1000 of FIG. 13.

Referring to FIGS. 14A and 14B, when an external power supply Ext is supplied normally, as illustrated by a thick arrow in FIG. 14A, power may be supplied from the external power supply Ext to main system block 500 or 500a through PLP block 700 or 700a and power block 900. In addition, power from the external power supply Ext may be supplied to charging unit 300 in PLP block 700 or 700a, and a charging operation of secondary power device 200 by using charging unit 300 may be performed periodically and repeatedly.

When the external power supply Ext is abnormal or not available for any reason and thus a SPO situation occurs, power may be supplied from secondary power device 200 to main system block 500 or 500a through PLP block 700 or 700a and power block 900, as illustrated by the thick arrow in FIG. 14B. Accordingly, as main system block 500 or 500a under an SPO situation continues operating by using the power of secondary power device 200, data loss may be prevented. When a defect is present in secondary power device 200, main system block 500 or 500a may not use the power of secondary power device 200 in an SPO situation, and thus data loss is unavoidable.

Electronic system 1000 according to the present embodiment may include monitoring apparatus 100 as described above. Accordingly, the state of secondary power device 200 may be checked by monitoring secondary power device 200 in real time, and when a defect is caused in secondary power device 200, operations such as controlling charging unit 300 or repairing or replacing secondary power device 200 may be performed. In sum, according to electronic system 1000 of the present embodiment, data loss that may occur in main system block 500 or 500a in an SPO situation due to a defect in secondary power device 200 may be prevented.

While the inventive concept has been particularly shown and described with reference to embodiments thereof, it will be understood that various changes in form and details may be made therein without departing from the spirit and scope of the following claims.

What is claimed is:

1. A method of monitoring a secondary power device, the method comprising:
charging, by a charging unit, the secondary power device including at least one capacitor, by supplying power from the charging unit to the secondary power device;
setting, by a calibration unit, a first reference parameter in a first calibration interval by using a voltage of the at least one capacitor;
setting, by the calibration unit, a second reference parameter in a second calibration interval by using the voltage of the at least one capacitor and the first reference parameter;
setting, by a level setting unit, a reference level for checking a state of the secondary power device, by using the second reference parameter; and
monitoring, by a monitoring unit, the state of the secondary power device by using the reference level.

2. The method of claim 1, wherein the voltage of the at least one capacitor ripples between a local maximum value and a local minimum value via a charging operation of the charging unit,
wherein the setting of the first reference parameter comprises:
detecting a maximum value of the voltage of the at least one capacitor in the first calibration interval;
detecting a minimum value of the voltage of the at least one capacitor in the first calibration interval; and
setting an average of the maximum value and the minimum value as the first reference parameter.

3. The method of claim 2, wherein the setting of the second reference parameter comprises:
classifying, in the second calibration interval, the voltage of the at least one capacitor into high state intervals and low state intervals by using the first reference parameter;
detecting, in the second calibration interval, first local maximum values in the high state intervals and calculating a first average value which is an average of the first local maximum values;
detecting, in the second calibration interval, first local minimum values in the low state intervals and calculating a second average value which is an average of the first local minimum values; and
setting an average of the first average value and the second average value as the second reference parameter.

4. The method of claim 3, further comprising extracting each of the first local maximum values from each of the high state intervals via a first comparison logic, and
extracting each of the first local minimum values each of the low state intervals via a second comparison logic.

5. The method of claim 3, wherein setting of the reference level comprises setting a range of ±Δ about a central value which is set to the second reference parameter as the reference level.

6. The method of claim 5, wherein Δ is set to a fixed value or a percentage (%) with respect to a difference between the first average value and the second average value.

7. The method of claim 1, further comprising:
measuring a discharging time of the at least one capacitor by using the reference level; and
comparing the discharging time with a set reference time to determine whether the secondary power device is operating abnormally.

8. The method of claim 7, further comprising:
obtaining an average discharging time by measuring and averaging a plurality of discharging times of the at least one capacitor; and
comparing the average discharging time with the reference time to determine whether the secondary power device is operating abnormally.

9. The method of claim 1, wherein the reference level is calibrated by repeatedly performing operations from the setting of the first reference parameter to the setting of the reference level for a set period, or the reference level is calibrated in real time by using the voltage of the at least one capacitor detected after the setting of the second reference parameter, in resetting of the second reference parameter and resetting of the reference level.

10. The method of claim 1, wherein setting of the reference level comprises setting a range of ±Δ about a central value which is set to the second reference parameter as the reference level.

11. The method of claim 10, further comprising:
measuring a discharging time from the voltage of the at least one capacitor corresponding to the second reference parameter +Δ, to a voltage of the at least one capacitor corresponding to the second reference parameter −Δ; and
comparing the discharging time with a set reference time to determine whether the secondary power device is operating abnormally.

12. A method of monitoring a secondary power device, the method comprising:
charging, by a charging unit, the secondary power device including at least one capacitor, by supplying power from the charging unit to the secondary power device;
setting, by a calibration unit, a first reference parameter in a first calibration interval, by using a voltage of the at least one capacitor, wherein the voltage ripples between a local maximum value and a local minimum value;
setting, by the calibration unit, a second reference parameter in a second calibration interval, by using the voltage of the at least one capacitor and the first reference parameter;
setting, by a level setting unit, a reference level to a range of ±Δ about a central value which is set to the second reference parameter; and
monitoring, by a monitoring unit, a state of the secondary power device by using the reference level,
wherein operations from the setting of the first reference parameter to the setting of the reference level are repeated for a set period.

13. The method of claim 12, further comprising:
setting the first reference parameter to an average of a maximum value and a minimum value of the voltage of the at least one capacitor in the first calibration;
classifying the voltage of the at least one capacitor in the second calibration interval into high state intervals and low state intervals by using the first reference parameter;
detecting first local maximum values from the high state intervals;
calculating a first average value as an average of the first local maximum values;
detecting first local minimum values from the low state intervals;
calculating a second average value as an average of the first local minimum values; and
setting an average of the first average value and the second average value as the second reference parameter.

14. The method of claim 13, wherein Δ is set to a fixed value or as a percentage (%) with respect to a difference between the first average value and the second average value.

15. The method of claim 12, further comprising:
measuring a discharging time from the voltage of the at least one capacitor corresponding to the second reference parameter +Δ, to a voltage of the at least one capacitor corresponding to the second reference parameter −Δ; and
comparing the discharging time with a set reference time to determine whether the secondary power device is operating abnormally.

16. A method, comprising:
charging, by a charging unit, a secondary power device;
in a first interval, measuring a capacitor voltage of the secondary power device;
detecting first local minimum values and first local maximum values of the measured capacitor voltage in the first interval;
setting a first reference parameter based on detected local minimum values and local maximum values;
in a second interval, measuring the capacitor voltage of the secondary power device;
setting a second reference parameter based on values of the measured capacitor voltage in the second interval together with the first reference parameter;
setting a reference level as a range centered about a voltage set to the second reference parameter;
in a third interval, measuring the capacitor voltage of the secondary power device;
measuring a discharging time of the capacitor voltage in the third interval by using the measured capacitor voltage in the third interval and the reference level; and
comparing the discharging time with a set reference time to determine whether the secondary power device is operating abnormally.

17. The method of claim 16, wherein setting a second reference parameter based on values of the measured capacitor voltage in the second interval together with the first reference parameter comprises:
classifying, in the second interval, the measured capacitor voltage into high state intervals and low state intervals using the first reference parameter;
detecting, in the second interval, second local maximum values in the high state intervals and calculating a first average value which is an average of the second local maximum values;
detecting, in the second interval, second local minimum values in the low state intervals and calculating a second average value which is an average of the second local minimum values; and
setting an average of the first average value and the second average value as the second reference parameter.

18. The method of claim 17, wherein each of the first local maximum values is extracted from each of the high state intervals via comparison logic, and
wherein each of the first local minimum values is extracted from each of the low state intervals via comparison logic.

19. The method of claim 17, wherein the range is ±Δ, and wherein Δ is set to a percentage (%) with respect to a difference between the first average value and the second average value.

20. The method of claim 16, wherein the range is ±Δ, and wherein Δ is set to a fixed value.

* * * * *